US009575846B2

(12) United States Patent
Tian

(10) Patent No.: US 9,575,846 B2
(45) Date of Patent: Feb. 21, 2017

(54) DISTRIBUTED STORAGE OF DATA

(71) Applicant: AT&T Intellectual Property I, L.P., Atlanta, GA (US)

(72) Inventor: Chao Tian, Madison, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 148 days.

(21) Appl. No.: 14/339,757

(22) Filed: Jul. 24, 2014

(65) Prior Publication Data

US 2016/0026543 A1  Jan. 28, 2016

(51) Int. Cl.
| G06F 11/00 | (2006.01) |
| G06F 11/14 | (2006.01) |
| G06F 17/00 | (2006.01) |
| G06F 11/10 | (2006.01) |
| H03M 13/37 | (2006.01) |
| H04L 29/08 | (2006.01) |
| H03M 13/15 | (2006.01) |

(52) U.S. Cl.
CPC ....... *G06F 11/1464* (2013.01); *G06F 11/1076* (2013.01); *G06F 17/00* (2013.01); *H03M 13/3761* (2013.01); *H04L 67/1097* (2013.01); *G06F 2201/805* (2013.01); *H03M 13/1515* (2013.01)

(58) Field of Classification Search
CPC .............. G06F 11/1464; G06F 11/1076; G06F 11/0727; G06F 11/1612; G06F 17/00; G06F 2201/805; H03M 13/3761; H03M 13/1515; H04L 67/1097
USPC .............. 714/6.24, 6.1, 6.2, 15, 42, 49, 751, 752,714/784
See application file for complete search history.

(56) References Cited

U.S. PATENT DOCUMENTS

| 6,961,890 | B2 | 11/2005 | Smith |
| 7,418,644 | B2 | 8/2008 | Smith et al. |
| 7,519,741 | B2 | 4/2009 | Khandelwal et al. |
| 8,312,356 | B1 * | 11/2012 | Cousins ................ H03M 13/15 |
| | | | 708/316 |
| 8,429,492 | B2 | 4/2013 | Yoon et al. |
| 8,631,269 | B2 | 1/2014 | Vinayak et al. |
| 2007/0168720 | A1 | 7/2007 | Chatterjee et al. |
| 2007/0245083 | A1 * | 10/2007 | Margolus ............ G06F 11/1096 |
| | | | 711/114 |
| 2011/0208994 | A1 * | 8/2011 | Chambliss .......... G06F 11/1092 |
| | | | 714/6.24 |

(Continued)

OTHER PUBLICATIONS

International Search Report and Written Opinion dated Oct. 13, 2015 in International Application No. PCT/US2015/041932.

(Continued)

*Primary Examiner* — Joseph D Manoskey
(74) *Attorney, Agent, or Firm* — Hartman & Citrin LLC

(57) ABSTRACT

Multi-reliability regenerating (MRR) erasure codes are disclosed. The erasure codes can be used to encode and regenerate data. In particular, the regenerating erasure codes can be used to encode data included in at least one of two or more data messages to satisfy respective reliability requirements for the data. Encoded portions of data from one data message can be mixed with encoded or unencoded portions of data from a second data message and stored at a distributed storage system. This approach can be used to improve efficiency and performance of data storage and recovery in the event of failures of one or more nodes of a distributed storage system.

20 Claims, 8 Drawing Sheets

(56) References Cited

U.S. PATENT DOCUMENTS

| | | | | |
|---|---|---|---|---|
| 2012/0166907 A1* | 6/2012 | Grube | ............ | G06F 21/62 714/755 |
| 2012/0173932 A1* | 7/2012 | Li | ............ | G06F 11/1076 714/42 |
| 2013/0073896 A1 | 3/2013 | Le Scouarnec | | |
| 2013/0262921 A1 | 10/2013 | Gao et al. | | |
| 2013/0297907 A1 | 11/2013 | Ki et al. | | |
| 2014/0020083 A1 | 1/2014 | Fetik | | |
| 2014/0082145 A1 | 3/2014 | Lacapra | | |
| 2014/0115579 A1 | 4/2014 | Kong | | |
| 2014/0122925 A1* | 5/2014 | Peake | ............ | G06F 11/10 714/6.24 |

OTHER PUBLICATIONS

Weber et al., "Rate region for a class of delay mitigating codes and P2P networks," IEEE 46th Annual Conference on Information Sciences and Systems (CISS), Mar. 21, 2012.

Yeung, R.W., "Information Theory and Network Coding," Chapter 21: Multi-Source Network Coding, Jan. 31, 2008, pp. 505-540, Springer.

Tian, Chao, "Repair-efficient distributed storage codes with heterogeneous reliability requirements," IEEE 52nd Annual Allerton Conference on Communication, Control, and Computing, Sep. 30, 2014, pp. 453-458.

Dimakis et al., "A Survey on Network Codes for Distributed Storage," Cornell University Library, Apr. 26, 2010.

Li et al., "A computational approach for determining rate regions and codes using entropic vector bounds," IEEE 50th Annual Allerton Conference on Communication, Control, and Computing, Oct. 1, 2012, pp. 1580-1587.

Cullina, Daniel, Alexandros G. Dimakis, and Tracey Ho. "Searching for minimum storage regenerating codes." *arXiv preprint arXiv:0910.2245*, Oct. 2009.

Wu, Yunnan, Alexandros G. Dimakis, and Kannan Ramchandran. "Deterministic regenerating codes for distributed storage." *Allerton Conference on Control, Computing, and Communication*. 2007.

"What's New in VMware® Virtual SAN", VMware, Feb. 2014.

* cited by examiner

DISTRIBUTED STORAGE OF DATA

COPYRIGHT NOTIFICATION

A portion of the disclosure of this patent document and its attachments contain material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

BACKGROUND

Distributed storage is commonly used to reliably store data. Should a storage node fail (which may regularly occur in large scale systems), the data may be reliably recovered from other, operating storage nodes.

BRIEF DESCRIPTION OF THE SEVERAL VIEWS OF THE DRAWINGS

The features, aspects, and advantages of the exemplary embodiments are understood when the following Detailed Description is read with reference to the accompanying drawings, wherein.

DETAILED DESCRIPTION

The exemplary embodiments will now be described more fully hereinafter with reference to the accompanying drawings. The exemplary embodiments may, however, be embodied in many different forms and should not be construed as limited to the embodiments set forth herein. These embodiments are provided so that this disclosure will be thorough and complete and will fully convey the exemplary embodiments to those of ordinary skill in the art. Moreover, all statements herein reciting embodiments, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating the exemplary embodiments. The functions of the various elements shown in the figures may be provided through the use of dedicated hardware as well as hardware capable of executing associated software. Those of ordinary skill in the art further understand that the exemplary hardware, software, processes, methods, and/or operating systems described herein are for illustrative purposes and, thus, are not intended to be limited to any particular named manufacturer.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will also be understood that, although the terms first, second, etc. may be used herein to describe various elements, these elements should not be limited by these terms. These terms are only used to distinguish one element from another. For example, a first device could be termed a second device, and, similarly, a second device could be termed a first device without departing from the teachings of the disclosure.

Figure 1:
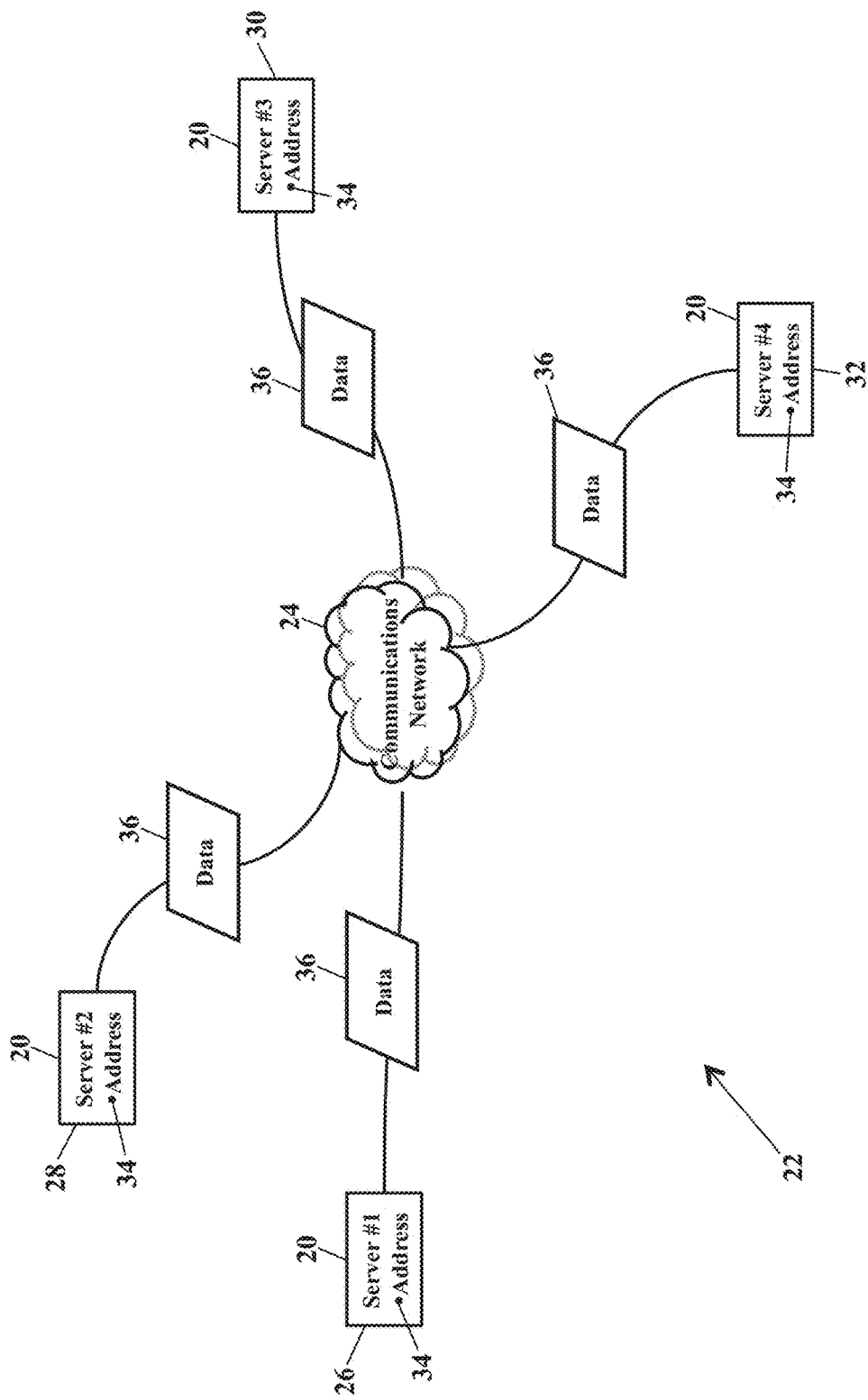
FIG. 1 is simplified schematic illustrating an environment in which exemplary embodiments may be implemented.

FIG. 1 is a simplified schematic illustrating an environment in which exemplary embodiments may be implemented. FIG. 1 illustrates different storage nodes 20 in a distributed storage system 22 of multiple interconnected storage nodes. The different storage nodes 20 communicate individually, or with each other, using a communications network 24. FIG. 1, for simplicity, illustrates each one of the different storage nodes 20 as different servers 26-32. In practice, though, any mobile or stationary processor-controlled device may function as any one of the storage nodes 20, as later paragraphs will explain. Regardless, each different storage node 20 is associated with a unique network address 34 in the communications network 24. When any data 36 needs to be reliably stored, the storage of the data 36 may be distributed across any of the storage nodes 20 in the communications network 24. That is, the distributed storage system 22 may comprise a network of servers, and/or other devices, that distribute storage of the data 36 to ensure redundancy. Should any of the storage nodes 20 fail, redundant portions of the data 36 may be recovered from other storage nodes 20. Because distributed storage systems are generally well known, no detailed explanation is needed.

Figure 2:
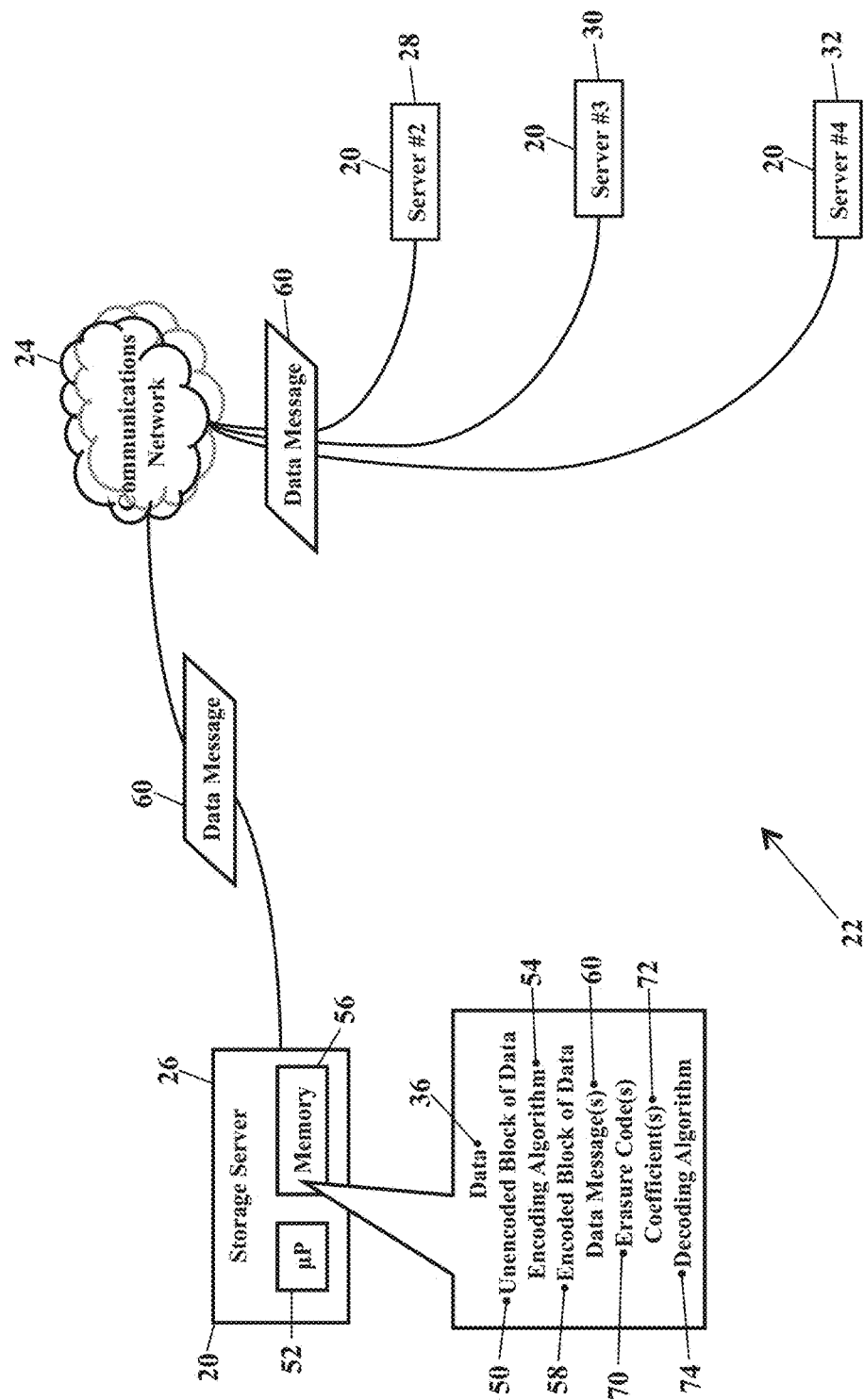
FIG. 2 is a more detailed illustration of a storage node, according to exemplary embodiments.

FIG. 2 is a more detailed illustration of one of the storage nodes 20, according to exemplary embodiments. The storage nodes are again illustrated as different servers 26-32. For example, the server 26 may be instructed to reliably and redundantly store the data 36 for retrieval. The data 36 is typically arranged as bits or bytes of information in video, music, and other files. Whatever the format of the data 36, the data 36 may be unencoded and typically divided into unencoded blocks 50 of data, with each individual unencoded block 50 of data having any size or quantity of bits. The server 26 has a processor 52 (e.g., "μP"), application specific integrated circuit (ASIC), or other component that executes an encoding algorithm 54 stored in memory 56. The encoding algorithm 54 transforms each individual unencoded block 50 of data into an encoded block 58 of data. The server 26 then disperses the encoded blocks 58 of data as different data messages 60 into the communications network 24. The server 26 routes the data messages 60 to one or more other storage nodes 20. Should any one of the storage nodes 20 fail, the data messages 60 stored at that failed storage node may be irretrievable. However, exemplary embodiments may reconstruct the data messages 60 stored at the failed storage node. That is, the data messages 60 stored at functioning storage nodes 20 may be used to reconstruct data lost on the failed storage node.

Exemplary embodiments may use any encoding algorithm. While there are many known algorithms, this disclosure will hereinafter be explained using the well-known Reed-Solomon coding. The Reed-Solomon coding may be used to detect and correct errors in data. For the purposes of this disclosure, the Reed-Solomon coding may be used as erasure codes 70 to recover the data lost to a failed storage node. Each one of the encoded data messages 60 thus contains information describing symbolic coefficients 72 of a polynomial expression. Consider a data message M having information symbols $(x_1, x_2, x_3)$. Application of the Reed-Solomon coding encodes the information symbols $(x_1, x_2, x_3)$ into ten (10) coded symbols $(z_1, z_2, z_3, \ldots z_{10})$. Should a storage node 20 fail, any three (3) members of the ten (10) coded symbols $z_i$ may be retrieved from the other storage nodes 20. The server 26 may then execute a decoding algorithm 74 to completely recover $M(x_1, x_2, x_3)$. The data message M has thus been reliably and redundantly stored in the distributed storage system 22.

Exemplary embodiments may be applied regardless of networking environment. The communications network 24 may be a wireless network having cellular, WI-FI®, and/or BLUETOOTH® capability. The communications network 24, however, may be a cable network operating in the radio-frequency domain and/or the Internet Protocol (IP) domain. The communications network 24, however, may also include a distributed computing network, such as the Internet (sometimes alternatively known as the "World Wide Web"), an intranet, a local-area network (LAN), and/or a wide-area network (WAN). The communications network 24 may include coaxial cables, copper wires, fiber optic lines, and/or hybrid-coaxial lines. The communications network 24 may even include wireless portions utilizing any portion of the electromagnetic spectrum and any signaling standard (such as the IEEE 802 family of standards, GSM/CDMA/TDMA or any cellular standard, and/or the ISM band). The communications network 24 may even include power line portions, in which signals are communicated via electrical wiring. The concepts described herein may be applied to any wireless/wireline communications network, regardless of physical componentry, physical configuration, or communications standard(s).

Figure 3:
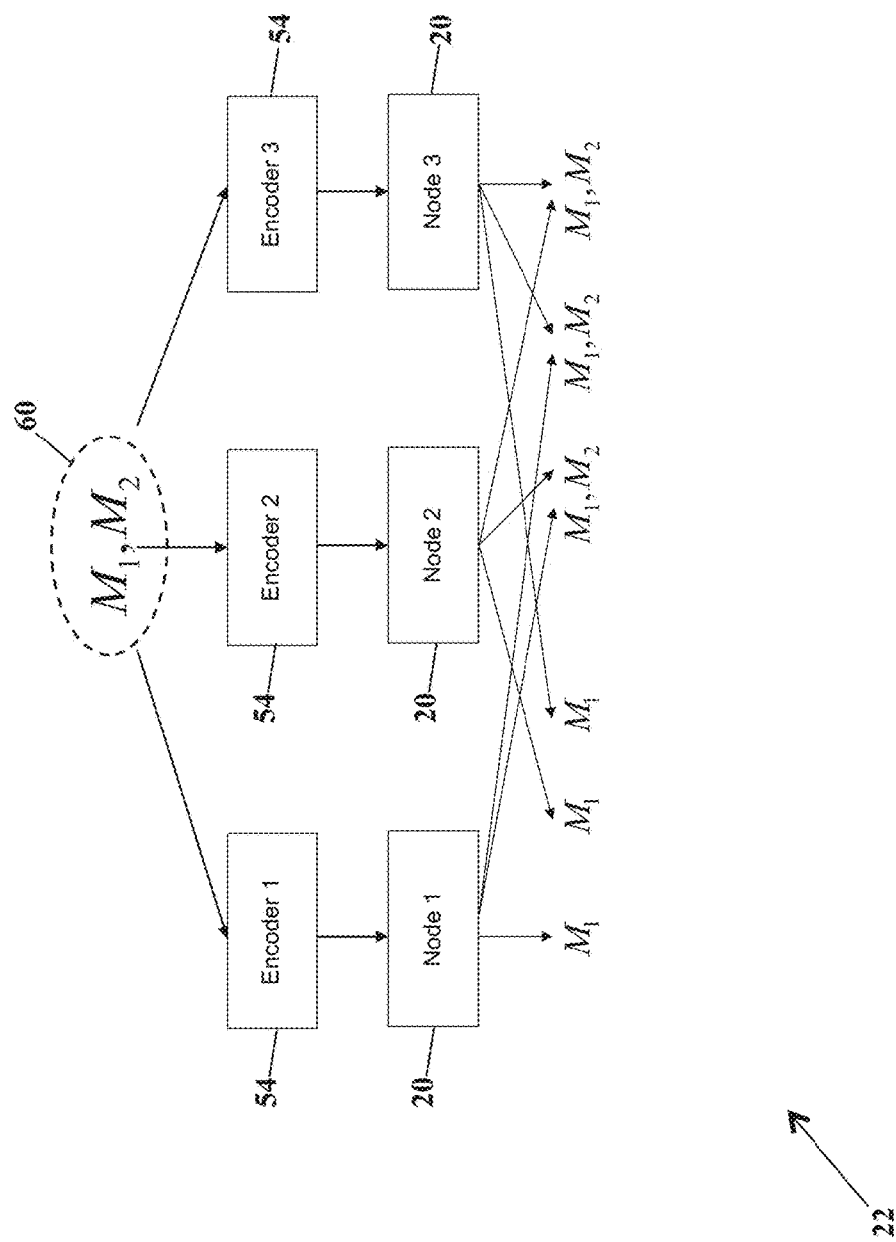
FIGS. 3-4 are schematics illustrating reliability requirements, according to exemplary embodiments.
Figure 4:
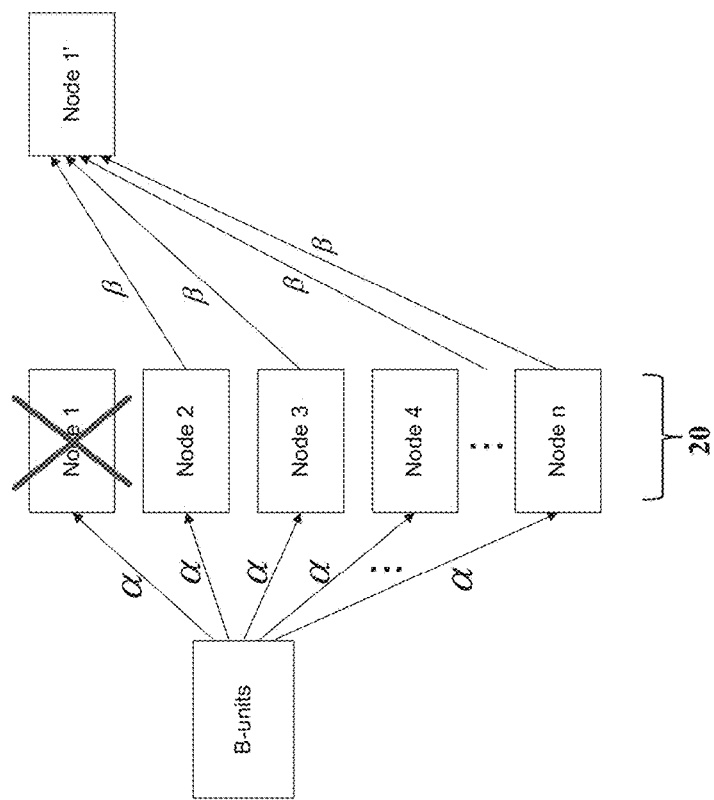

FIGS. 3-4 are schematics illustrating reliability requirements, according to exemplary embodiments. The digital contents stored in large-scale distributed storage systems usually have different reliability requirements. For example, a company may consider it important to protect recent customer billing records with a very reliable erasure code (illustrated as reference numeral 70 in FIG. 2). However, old data (such as 10-year old word processing files) may not need high redundancy in backups, so weaker erasure codes 70 may be used with a higher probability of data loss. Such flexibility can significantly reduce the cost of hardware infrastructure, and there is tremendous interest recently in designing efficient software defined storage (SDS) systems utilizing flexible erasure codes 70. The theoretical framework of symmetric multilevel diversity (MLD) coding is a rather natural fit for this scenario, where there are a total of $k_0 \leq n$, of independent messages m $(m_1, m_2, \ldots m_{k0})$ to be stored, where n is the number of the storage nodes 20 situated in different network locations, each with $\alpha$ units of data. The data messages 60 are encoded in such a way that by accessing any $k \leq k_0$ of these storage nodes 20, the first k messages $(m_1, m_2, \ldots m_k)$ can be completely recovered.

FIG. 4 illustrates a repair of a failed storage node 20. Disk or node failures occur regularly in a large-scale storage system, and the overall quality of service is heavily affected by the efficiency of the repair process. The regenerating codes 70 have been used to address the tradeoff between the storage and repair-bandwidth in erasure-coded distributed storage systems. To repair a failed storage node, a new storage node requests $\beta$ units of data each from any of the d remaining, operational storage nodes 20, and regenerates the $\alpha$ units of content to store on the new node. The content regenerated is allowed to be only functionally equivalent to the content on the failed node, thus the name "functional-repair" regenerating codes. In practice, requiring the content regenerated to be exactly the same as that on the failed node can simplify the system design significantly, and thus exemplary embodiments may be used "exact-repair" regenerating codes 70.

In the conventional regenerating code framework, only a single data message 60 is allowed. The single data message 60 only offers a single level of reliability. In the theoretical framework of symmetric multilevel diversity (MLD) coding, however, the data repair process was not considered. Exemplary embodiments thus consider repair-efficient codes in systems with heterogeneous reliability requirements, and exemplary embodiments investigate the optimal storage verses repair-bandwidth tradeoff. Because of the connection to the MLD problem and the regenerating code problem, this disclosure uses the term multi-reliability regenerating (or "MRR") codes 70. This disclosure explains exact-repair for when $d=n-1$, as this scenario is perhaps the most practical case. In general, though, the framework may be generalized to other scenarios of $d=n-x$, where x is less than n (e.g., the number of the storage nodes 20 situated in different network locations).

Exemplary embodiments may mix the symbolic coefficients (illustrated as reference numeral 72 in FIG. 2). An intuitive and straightforward coding strategy is to use individual regenerating code for each data message 60 to satisfy the respective reliability requirement. Exemplary embodiments, however, may determine that better results are obtained using codes that mix the symbolic coefficients 72 of different data messages 60. Previous studies have shown that, without the repair consideration, no mixing is necessary for the symmetric MLD coding problem. Exemplary embodiments, however, may determine that with repair consideration, although for the case of n=3, the optimal solution does not require mixing. Yet, for the case of n=4 storage nodes, mixing can strictly improve upon the performance of the separate coding solution.

The multi-reliability regenerating (or "MRR") codes 70 are now defined. The notation $I_n$ is used to denote the set $\{1, 2, \ldots, n\}$, and $|A|$ is used to denote the cardinality of a set A.

Definition 1

An $(N_1, N_2, \ldots, N_d, K_d, K)$ multi-reliability regenerating code consists of n encoding functions $$f_i^E(\cdot), \sum_{i=1}^{d} \binom{n}{i}$$

decoding functions $f_A^D(\bullet, \ldots, \bullet)$, $n(n-1)$ repair encoding functions $f_{i,j}^E(\bullet)$, and $n$ repair decoding functions $F_i^D(\bullet, \ldots, \bullet)$, where $$f_i^E : I_{N_1} \times I_{N_2} \times \ldots \times I_{N_d} \rightarrow I_{K_d}, i \in I_n,$$

each of which maps the message $(m_1, m_2, \ldots m_d) \in I_{N1} \times I_{N2} \times \ldots \times I_{Nd}$ to one piece of coded information, $$f_A^D : I_{K_d} \times I_{K_d} \times \ldots \times I_{K_d} \rightarrow I_{N_1} \times I_{N_2} \times \ldots \times I_{N_{|A|}},$$

$A \subset I_n$ and $|A| \leq d$, each of which maps coded information stored on the set A of nodes to the first $|A|$ messages $(m_1, m_2, \ldots m_{|A|})$, $$F_{i,j}^E : I_{K_d} \rightarrow I_{K_s}, j \in I_n, \text{ and } i \in I_n \setminus \{j\},$$

each of which maps d such indices from the helper nodes to reconstruct the information stored at the failed node. The functions must satisfy the data reconstruction conditions $$f_A^D\left(\prod_{i \in A} f_i^E(m_1, m_2, \ldots, m_d)\right) = (m_1, m_2, \ldots, m_{|A|}),$$

$(m_1, m_2, \ldots, m_d) \in I_{N_1} \times I_{N_2} \times \ldots \times I_{N_d}$, $A \subset I_n$ and $|A| \leq d$, and the repair conditions $$F_j^D\left(\prod_{i \in I_n \setminus \{j\}} F_{i,j}^E(f_i^E(m_1, m_2, \ldots, m_d))\right) = f_j^E(m_1, m_2, \ldots, m_d),$$

$(m_1, m_2, \ldots, m_d) \in I_{N_1} \times I_{N_2} \times \ldots \times I_{N_d}$, $j \in I_n$.

It can be assumed without loss of generality $d = k_0$, then the messages $(m_{d+1}, m_{d+2}, \ldots, m_{k_0})$ can be viewed as part of $m_d$; on the other hand if $d > k_0$, then one may simply consider an alternative problem with $k'_0 = d$ and define the messages $m_{k_0}, m_{k_0+1}, \ldots m_d$ to be degenerate. Note that $\alpha = \log K_d$ is the storage size, $\beta = \log K$ is the repair bandwidth, and $B_i = \log N_i$ is the rate of the $i$-th message; the base of $\log(\bullet)$ is arbitrary, and choose base 2 for convenience. Because of the linear scaling relation among them, one may thus consider the normalized version as follows.

Definition 2

A normalized bandwidth-storage pair $(\bar{\alpha}, \bar{\beta})$ is said to be achievable with n nodes and normalized message rates $(\bar{B_1}, \bar{B_2}, \ldots, \bar{B_d})$ if for any $\epsilon > 0$ there exists an $(N_1, N_2, \ldots, N_d, K_d, K)$ multi-reliability regenerating code such that $$\bar{\alpha} + \epsilon \geq \frac{\log K_d}{\sum_{i=1}^d \log N_i},$$

$$\bar{\beta} + \epsilon \geq \frac{\log K}{\sum_{i=1}^d \log N_i},$$

$$\bar{B_i} - \epsilon \leq \frac{\log N_i}{\sum_{i=1}^d \log N_i}, i = 1, 2, \ldots, d.$$

The collection of all the achievable $(\bar{\alpha}, \bar{\beta})$ pairs for normalized message rates $(\bar{B_1}, \bar{B_2}, \ldots, \bar{B_d})$ is the achievable rate region $\mathcal{R}_n(\bar{B_1}, \bar{B_2}, \ldots, \bar{B_d})$ of the multi-reliability regenerating codes 70.

Figure 5:
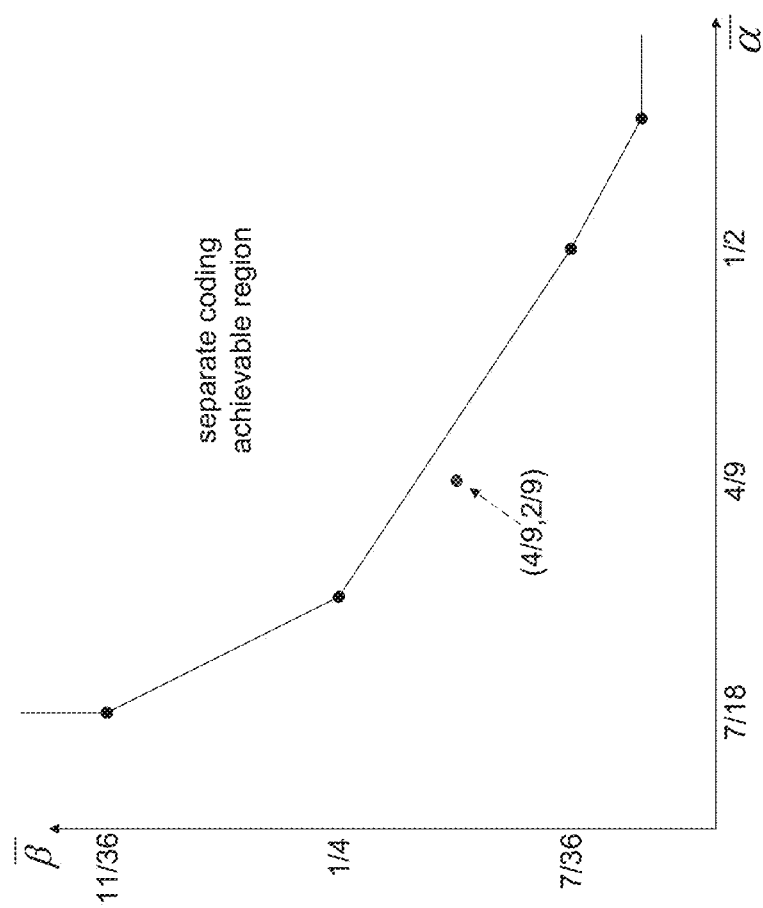
FIG. 5 is a schematic illustrating a rate region, according to exemplary embodiments.

FIG. 5 is a schematic illustrating a rate region, according to exemplary embodiments. One straightforward achievable coding strategy is to encode each individual message using a regenerating code of the necessary strength. More precisely, the message $M_k$ is encoded using an (n, k, d) regenerating code 70 (i.e., any k nodes can recover the message $M_k$, and any new node obtains information from any d nodes for repair) of rate $(\alpha_k, \beta_k)$, and the resultant code 70 thus has storage rate and repair rate:

$$\alpha = \sum_{k=1}^d \alpha_k, \beta = \sum_{k=1}^d \beta_k.$$

In order to characterize this region $\mathcal{R}_n(\bar{B_1}, \bar{B_2}, \ldots, \bar{B_d})$, rate region characterization of each individual regenerating code 70 may be needed; e.g., for the case of n=3, rate region characterizations for (3, 1, 2) and (3, 2, 2) regenerating codes 70 are needed. However, such characterizations for general parameters are still unknown, except for the case of k=1,2, and the special case (n, k, d)=(4, 3, 3) which was only recently established. Fortunately, using these existing results, one may provide characterization for the separate coding achievable region for MRR when n=3, denoted as $\tilde{\mathcal{R}}_3(\bar{B_1}, \bar{B_2})$, and that when n=4, denoted as $\tilde{\mathcal{R}}_4(\bar{B_1}, \bar{B_2}, \bar{B_3})$. FIG. 5, for example, illustrates an achievable rate region $\tilde{\mathcal{R}}_4(0, 1/3, 2/3)$.

Proposition 1:

The rate region $\tilde{\mathcal{R}}_3(\bar{B_1}, \bar{B_2})$ achievable using separate coding is the set of $(\bar{\alpha}, \bar{\beta})$ pairs satisfying the following conditions $$\bar{\alpha} \geq \bar{B_1} = \frac{\bar{B_2}}{2}, \bar{\alpha} + \bar{\beta} \geq \frac{3\bar{B_1}}{2} + \bar{B_2}, \bar{\beta} \geq \frac{\bar{B_1}}{2} + \frac{\bar{B_2}}{3}.$$

Proposition 2:

The rate region $\tilde{\mathcal{R}}_4(\bar{B_1}, \bar{B_2}, \bar{B_3})$ achievable using separate coding is the set of $(\bar{\alpha}, \bar{\beta})$ pairs satisfying the following conditions $$\bar{\alpha} \geq \bar{B_1} + \frac{\bar{B_2}}{2} + \frac{\bar{B_3}}{3} \tag{1}$$

$$2\bar{\alpha} + \bar{\beta} \geq \frac{7\bar{B_1}}{4} + \frac{5\bar{B_3}}{4} + \bar{B_3} \tag{2}$$

$$4\bar{\alpha} + 6\bar{\beta} \geq 6\bar{B_1} + \frac{7\bar{B_2}}{2} + 3\bar{B_3} \tag{3}$$

$$\bar{\alpha} + 2\bar{\beta} \geq \frac{5\bar{B_1}}{3} + \bar{B_2} + \frac{5}{6}\bar{B_3} \tag{4}$$

$$\bar{\beta} \geq \frac{\bar{B_1}}{3} + \frac{1}{5}\bar{B_2} + \frac{1}{6}\bar{B_3}. \tag{5}$$

FIG. 5 thus illustrates this achievable region for the case $\bar{B_2} = 1/3$ and $\bar{B_3} = 2/3$.

Results are now discussed regarding the case of n=3 multi-reliability regenerating codes 70.

Theorem 1: $\mathcal{R}_3(\bar{B_1}, \bar{B_2}) = \tilde{\mathcal{R}}_3(\bar{B_1}, \bar{B_2})$.

The forward direction
$\tilde{\mathcal{R}}_3(\bar{B_1}, \bar{B_2}) \subseteq \mathcal{R}_3(\bar{B_1}, \bar{B_2})$ is straightforward, and the converse direction is proved in later paragraphs. This theorem states that for the case of (n, d)=(3, 2), the strategy of separate coding is optimal, and there is no need to mix the data messages 60. However, the below result shows that this is, in general, not true, and mixing the messages is beneficial.

Theorem 2: The rate pair $\left(\frac{4}{9}, \frac{2}{9}\right) \in \mathcal{R}_4\left(0, \frac{1}{3}, \frac{2}{3}\right)$, but $\left(\frac{4}{9}, \frac{2}{9}\right) \notin \tilde{\mathcal{R}}_4\left(0, \frac{1}{3}, \frac{2}{3}\right)$.

In other words, the inclusion $$\tilde{\mathcal{R}}_4\left(0, \frac{1}{3}, \frac{2}{3}\right) \subset \mathcal{R}_4\left(0, \frac{1}{3}, \frac{2}{3}\right)$$

is strict. This theorem provides a case where by mixing the data messages 60, a point outside of the separate coding rate region can be achieved (as FIG. 5 illustrates). It is clear that more generally such mixing is necessary for the optimal solution.

Theorem 2 is now proved.

Proof: Let us first show that $\left(\frac{4}{9}, \frac{2}{9}\right) \notin \tilde{\mathcal{R}}_4\left(0, \frac{1}{3}, \frac{2}{3}\right)$.

Substituting the quantities $$\alpha = \frac{4}{9}, \beta = \frac{2}{9}, B_1 = 0, B_2 = \frac{1}{3}, B_3 = \frac{2}{3},$$

to test inequality (3), it is clear that this inequality is not satisfied, and thus the claim.

It remains to show $\left(\frac{4}{9}, \frac{2}{9}\right) \in \mathcal{R}_4\left(0, \frac{1}{3}, \frac{2}{3}\right)$, for which we give a novel code construction where $B_1 = 0$, $$B_2 = 3, B_3 = 6, \alpha = 4 \text{ and } \beta = 2.$$

For concreteness, the code symbols and algebraic operations are in $GF(2^4)$.

Let us denote the information symbols of message $M_2$ as $(x_1, x_2, x_3)$, and the symbols of message $M_3$ as $(y_1, y_2, \ldots, y_6)$.

Exemplary embodiments may encode. First use a (10, 3) MDS erasure code (e.g., Reed-Solomon code) to encode $(x_1, x_2, x_3)$ into ten (10) coded symbols $(z_1, z_2, \ldots, z_{10})$, such that any three symbols can completely recover $(x_1, x_2, x_3)$. Then place the linear combination of the symbols into memory of the nodes as in Table I (below), where the addition + is also in $GF(2^4)$.

TABLE I

| A CODE FOR n = 4 WHERE $(\alpha, \beta)$ = (4, 2) AND $(B_1, B_2, B_3)$ = (0, 3, 6). | | | | |
|---|---|---|---|---|
| | symbol 1 | symbol 2 | symbol 3 | symbol 4 |
| node 1 | $z_1$ | $z_5 + y_1$ | $y_2$ | $y_3$ |
| node 2 | $z_2$ | $z_6 + y_4$ | $y_1$ | $y_5$ |

TABLE I-continued

| A CODE FOR n = 4 WHERE $(\alpha, \beta)$ = (4, 2) AND $(B_1, B_2, B_3)$ = (0, 3, 6). | | | | |
|---|---|---|---|---|
| | symbol 1 | symbol 2 | symbol 3 | symbol 4 |
| node 3 | $z_3$ | $z_7 + y_2$ | $y_6 + z_{10}$ | $y_4$ |
| node 4 | $z_4$ | $z_8 + y_3$ | $y_5 + z_9$ | $y_6$ |

The server 26 may thus store the symbolic coefficients in a database that maps the symbolic coefficients to the address(es) of the storage node(s). Should any one of the storage noes fail, the database may be queried for the symbolic coefficients stored at other storage nodes. Any symbolic coefficients may thus be retrieved for quick regeneration of a data message.

Exemplary embodiments may also decode. Message $M_2$ may be decoded using any two nodes. For example, to decode $M_2$, the reader may observe, from Table I, that any pair of nodes has two symbols involving the same $y_j$, in the form of $(z_i+y_j)$ in one node and $y_j$ in the other node. For example, node 2 has symbol $z_6+y_4$ and node 3 has $y_4$. This implies $z_i$ can be recovered, and together with the first symbols stored in this pair of nodes, three distinct symbols are known in the set $(z_1, z_2, \ldots, z_{10})$. Thus by the property of the MDS code, these three symbols can be used to recover $(x_1, x_2, x_3)$ and thus the message $M_2$.

Decoding may also be performed for messages $M_2$ and $M_3$ using any three nodes. Recall that by using any two nodes, the message $M_2$ may be recovered, and thus all the code symbols $(z_1, z_2, \ldots, z_{10})$. This result implies that when three nodes are available, all the $z_i$ symbols may be first eliminated in the linear combinations. However, it is clear that after this step all the symbols $(y_1, y_2, \ldots, y_6)$ are directly available, and thus the message $M_3$ can be decoded.

Exemplary embodiments may also repair using any three nodes. To regenerate the symbols in one node from the other three, each of the helper nodes sends the first symbol stored on the nodes as the initial step. Denote the y symbols on the failed node as $(y_i, y_j, y_k)$, which may be stored in a form also involving z-symbols. The helper nodes each find in the symbols stored on it the one involving $y_i$, $y_j$, and $y_k$, respectively, and send these symbol combinations as the second step. The placement of the y-symbol guarantees that these symbols are stored on the three helper nodes respectively. Recall that from any three z-symbols available in the initial step, the message $M_2$ can be recovered, and thus any of the z-symbols. This implies that $(y_i, y_j, y_k)$ can be recovered after eliminating the z symbols from the received symbol combinations in the second step, and thus all the symbols on the failed node can be successfully regenerated. Each helper node contributes exactly two (2) symbols in this process.

In the above code, the linear combinations of z-symbols and y-symbols are not necessarily in $GF(2^4)$, and it can even be $GF(2)$. The only constraint on the alphabet size is through the MDS erasure code used when encoding $(x_1, x_2, x_3)$, and this disclosure uses $GF(2^4)$ for simplicity. The reader may recognize that if message $M_2=(x_1, x_2, x_3)$ does not exist, the remaining code involving y's is a degenerate case of the known repair-by-transfer code.

A proof of Proposition 1 is now presented. It is known that the rate region of (3, 1, 2) regenerating codes (before normalization) is $$\alpha_1 \geq B_1, \beta_1 \geq \frac{B_2}{2},$$

and the rate region of (3, 2, 2) regenerating codes is $$2\alpha_2 \geq B_2, \alpha_2 + \beta_2 \geq B_2, 3\beta_2 \geq B_2.$$

It is straightforward to verify that that the separate coding indeed leads to the rate region given in Proposition 1 using Fourier-Motzkin elimination.

A proof of Proposition 2 is now presented. Using Fourier-Motzkin elimination directly for this case is time-consuming, so exemplary embodiments instead consider inner bounding and outer bounding the region. It is known that the rate region of (4, 1, 3) regenerating codes is $$\alpha_1 \geq B_1, \beta_1 \geq \frac{B_1}{3}, \quad (8)$$

and thus there is only one corner point of the rate region, which is $$\left(B_1, \frac{B_1}{3}\right).$$

The rate region of (4, 2, 3) regenerating codes is $$2\alpha_2 \geq B_2, \alpha_2 + 2\beta_2 \geq B_2, 5\beta_2 \geq B_2, \quad (9)$$

and there are two corner points in this rate region, which are $$\left(\frac{B_2}{2}, \frac{B_2}{4}\right), \left(\frac{3B_2}{5}, \frac{B_2}{5}\right). \quad (10)$$

The rate region of (4, 3, 3) regenerating codes is $$3\alpha_2 \geq B_3, 2\alpha_2 + \beta_2 \geq B_3, 4\alpha_2 + 6\beta_2 \geq 3B_3, 6\beta_2 \geq B_3. \quad (11)$$

There are three corner points in this rate region, which are $$\left(\frac{B_3}{3}, \frac{B_3}{3}\right), \left(\frac{3B_3}{8}, \frac{B_3}{4}\right), \left(\frac{B_3}{2}, \frac{B_3}{6}\right). \quad (12)$$

It is straightforward to show that the inequalities in Proposition 2 have to hold in this achievability scheme, e.g., $$4\alpha + 6\beta = 4(\alpha_1 + \alpha_2 + \alpha_3) + 6(\beta_1 + \beta_2 + \beta_3) \quad (13)$$

$$\stackrel{(a)}{\geq} 6B_1 + 4(\alpha_2 + \alpha_3) + 6(\beta_2 + \beta_3)$$

$$= 6B_1 + \alpha_2 + 3(\alpha_2 + \beta_2) + (4\alpha_3 + 6\beta_3)$$

$$\stackrel{(b)}{\geq} 6B_1 + \frac{7}{2}B_2 + (4\alpha_3 + 6\beta_3)$$

$$\stackrel{(c)}{\geq} 6B_1 + \frac{7}{2}B_2 + 3B_3,$$

where Equation (a) is because of Equation (8), Equation (b) because of Equation (9), and Equation (c) because of Equation (11). Referring to FIG. 5, the corner points of the region in Proposition 2 are $$\left(\overline{B}_1 + \frac{\overline{B}_2}{2} + \frac{\overline{B}_3}{3}, \frac{\overline{B}_1}{3} + \frac{\overline{B}_2}{4} + \frac{\overline{B}_3}{3}\right)$$

$$\left(\overline{B}_1 + \frac{\overline{B}_2}{2} + \frac{3\overline{B}_3}{8}, \frac{\overline{B}_1}{3} + \frac{\overline{B}_2}{4} + \frac{\overline{B}_3}{4}\right)$$

$$\left(\overline{B}_1 + \frac{\overline{B}_2}{2} + \frac{\overline{B}_3}{2}, \frac{\overline{B}_1}{3} + \frac{\overline{B}_2}{4} + \frac{\overline{B}_3}{6}\right)$$

$$\left(\overline{B}_1 + \frac{3\overline{B}_2}{5} + \frac{\overline{B}_3}{2}, \frac{\overline{B}_1}{3} + \frac{\overline{B}_2}{5} + \frac{\overline{B}_3}{6}\right),$$

and it is easily seen that these rate pairs are all achievable. The proof is thus complete.

A converse proof of Theorem 1 is now presented. It is already known that only symmetric codes need be considered, where permutations of node indices do not change joint entropy values. Thus without loss of generality, exemplary embodiments may restrict the proof to symmetric codes only. Denote the information stored at node i as $W_i$, and the helper information sent from node i to node j as $S_{i,j}$. First write the following inequalities $$\alpha \geq H(W_1) \stackrel{(a)}{=} H(W_1, M_1) \quad (14)$$

$$\geq H(W_1 \mid M_1) + B_1$$

$$\stackrel{(s)}{=} B_1 + \frac{1}{2}[H(W_1 \mid M_1) + H(W_2 \mid M_1)]$$

$$\geq B_1 + \frac{1}{2}H(W_1, W_2 \mid M_1)$$

$$\stackrel{(c)}{=} B_1 + \frac{1}{2}H(W_1, W_2, M_2 \mid M_1)$$

$$\geq B_1 + \frac{1}{2}H(M_2 \mid M_1)$$

$$\geq B_1 + \frac{1}{2}B_2,$$

where Equation (a) is because message $M_1$ can be recovered from $W_1$ alone, and Equation (s) implies by the existence of symmetric solutions, Equation (c) is because $(W_1, W_2)$ together can recover $M_2$. Dividing both sides of Equation (14) by $(B_1+B_2)$ gives the result. The proof next uses Equation (s) to denote by the reason of the symmetry. Next, $\beta$ is bound by writing $$\beta \geq \frac{1}{2}[H(S_{1,3}) + H(S_{2,3})] \quad (15)$$

$$\geq \frac{1}{2}[H(S_{1,3}, S_{2,3})]$$

$$\stackrel{(a)}{=} \frac{1}{2}[H(S_{1,3}, S_{2,3}, W_3, M_1)]$$

$$\geq \frac{1}{2}B_1 + \frac{1}{2}H(S_{1,3}, S_{2,3}, W_3 \mid M_1),$$

where Equation (a) is because from the helper message $S_{1,3}$ and $S_{2,3}$, and $W_3$ can be regenerated. To bound the second term above, write $$H(S_{1,3}, S_{2,3}, W_3 \mid M_1) \stackrel{(a)}{=} H(S_{1,3}, S_{2,3}, W_3, S_{3,1}, S_{3,2} \mid M_1) \quad (16)$$

$$\geq H(S_{1,3}, S_{2,3}, S_{3,1}, S_{3,2} \mid M_1)$$

$$\stackrel{(s)}{=} \frac{1}{3}\begin{bmatrix} H(S_{1,3}, S_{2,3}, S_{3,1}, S_{3,2} \mid M_1) + \\ H(S_{1,2}, S_{3,2}, S_{2,1}, S_{2,3} \mid M_1) + \\ H(S_{3,1}, S_{2,1}, S_{1,2}, S_{1,3} \mid M_1) \end{bmatrix}$$

-continued $$\overset{b}{\geq} \frac{1}{3}\begin{bmatrix} H(S_{1,3}, S_{2,3}, S_{3,1}, S_{3,2}, S_{1,2}, S_{2,1} \mid M_1) + \\ H(S_{3,2}, S_{2,3} \mid M_1) + \\ H(S_{3,1}, S_{2,1}, S_{1,2}, S_{1,3} \mid M_1) \end{bmatrix}$$

$$\overset{(c)}{=} \frac{1}{3}\begin{bmatrix} B_2 + H(S_{3,2}, S_{2,3} \mid M_1) + \\ H(S_{3,1}, S_{2,1}, S_{1,2}, S_{1,3} \mid M_1) \end{bmatrix}$$

$$\geq \frac{1}{3}[B_2 + H(S_{3,2}, S_{2,3}, S_{3,1}, S_{2,1}, S_{1,2}, S_{1,3} \mid M_1)]$$

$$\geq \frac{1}{3}[H_2 + H(M_2 \mid M_1)]$$

$$\geq \frac{2B_2}{3},$$

where Equation (a) is because $S_{3,1}$, $S_{3,2}$ are functions of $W_3$, Equation (b) is because $$H(S_{1,3},S_{3,1}|S_{3,2},S_{2,3},M_1) \geq H(S_{1,3},S_{3,1}|S_{1,2},S_{3,2},S_{2,1},S_{2,3},M_1), \quad (17)$$

and Equation (c) is because from $(S_{1,3},S_{2,3},S_{3,1},S_{2,1})$ the information $(W_1, W_3)$ can be regenerated and subsequently decode message $M_2$. It follows that $$\beta \geq \frac{1}{2}B_1 + \frac{1}{3}B_2. \quad (18)$$

The remaining inequality in Theorem 1 can be proved by writing the following:

$$\alpha + \beta \geq B_1 + H(W_1 \mid M_1) + \frac{1}{2}[B_1 + H(S_{1,3}, S_{2,3}, W_3 \mid M_1)] \quad (19)$$

$$= \frac{3}{2}B_1 + H(W_1, S_{1,2}, S_{1,3} \mid M_1) +$$

$$\frac{1}{2}H(S_{1,3}, S_{2,3}, W_3 \mid M_1)$$

$$= \frac{3}{2}B_1 + \frac{1}{2}H(W_1, S_{1,2}, S_{1,3} \mid M_1) +$$

$$\frac{1}{2}[H(W_1, S_{1,2}, S_{1,3} \mid M_1) + H(S_{1,3}, S_{2,3}, W_3 \mid M_1)]$$

$$\geq \frac{3}{2}B_1 + \frac{1}{2}H(W_1, S_{1,2}, S_{1,3} \mid M_1) +$$

$$\frac{1}{2}[H(W_1, W_3, S_{1,2}, S_{1,3}, S_{2,3} \mid M_1) + H(S_{1,3} \mid M_1)]$$

$$= \frac{3}{2}B_1 + \frac{1}{2}B_2 + \frac{1}{2}[H(W_1, S_{1,2}, S_{1,3} \mid M_1) + H(S_{1,3} \mid M_1)]$$

$$\overset{(a)}{=} \frac{3}{2}B_1 + \frac{1}{2}B_2 +$$

$$\frac{1}{2}[H(W_1, S_{1,2}, S_{1,3} \mid M_1) + H(S_{2,3} \mid M_1)]$$

$$\geq \frac{3}{2}B_1 + \frac{1}{2}B_2 + \frac{1}{2}[H(W_1, S_{1,2}, S_{1,3}, S_{2,3} \mid M_1)]$$

$$= \frac{3}{2}B_1 + B_2.$$

The proof is thus complete.

Exemplary embodiments thus considered multi-reliability regenerating (MRR) codes, which address the storage vs. repair-bandwidth tradeoff in distributed storage systems with heterogeneous reliability requirements. Separate coding using individual regenerating code to satisfy the respective reliability requirement is not optimal, and mixing the information can strictly improve the efficiency of the codes 70.

Figure 6:
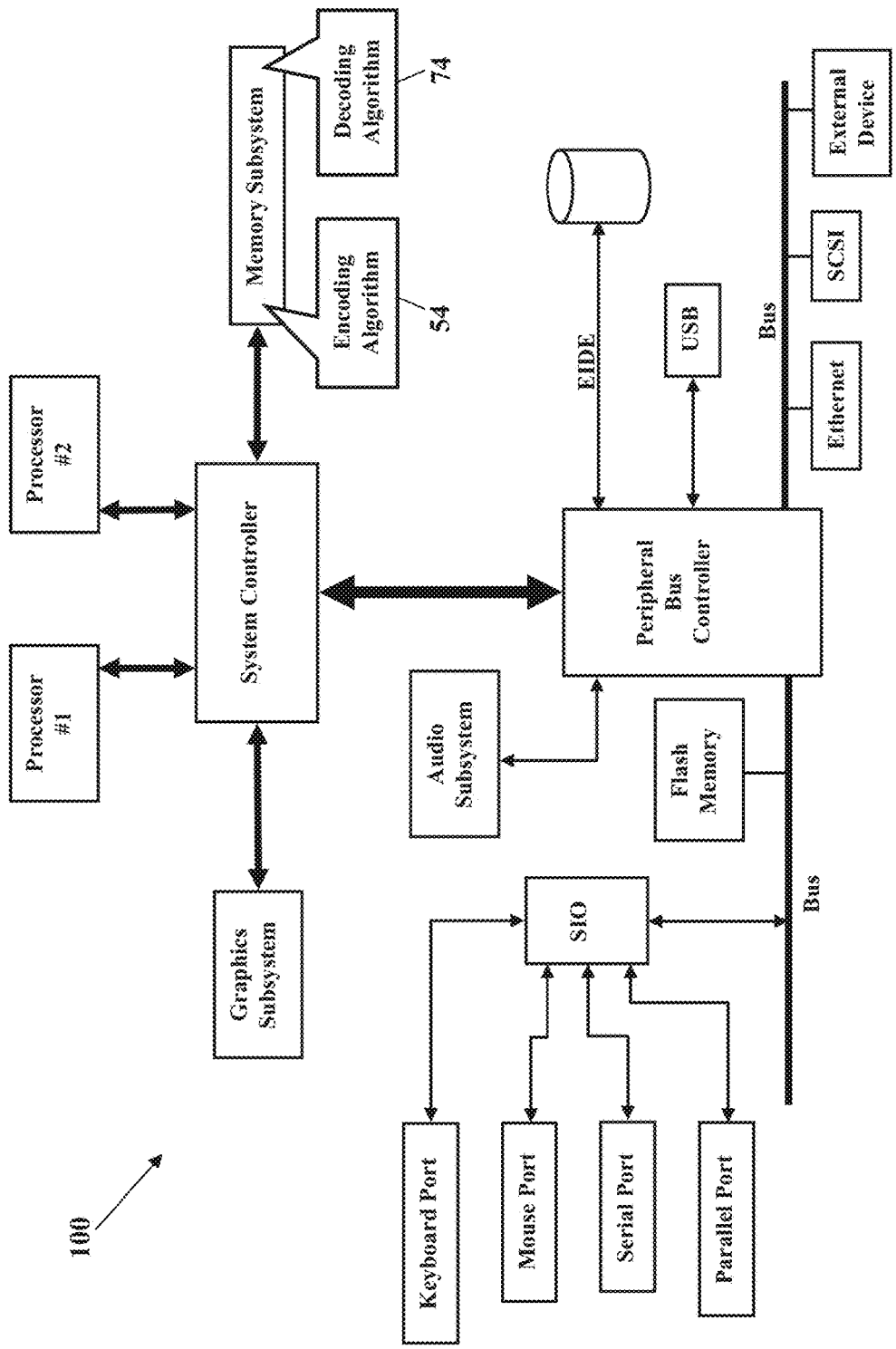
FIGS. 6-7 depict still more operating environments for additional aspects of the exemplary embodiments.

FIG. 6 is a schematic illustrating still more exemplary embodiments. FIG. 6 is a more detailed diagram illustrating a processor-controlled device 100. As earlier paragraphs explained, the encoding 54 and the decoding algorithm 74 may operate in any processor-controlled device. FIG. 6, then, illustrates the encoding algorithm 54 and the decoding algorithm 74 stored in a memory subsystem of the processor-controlled device 100. One or more processors communicate with the memory subsystem and execute either, some, or all applications. Because the processor-controlled device 100 is well known to those of ordinary skill in the art, no further explanation is needed.

Figure 7:
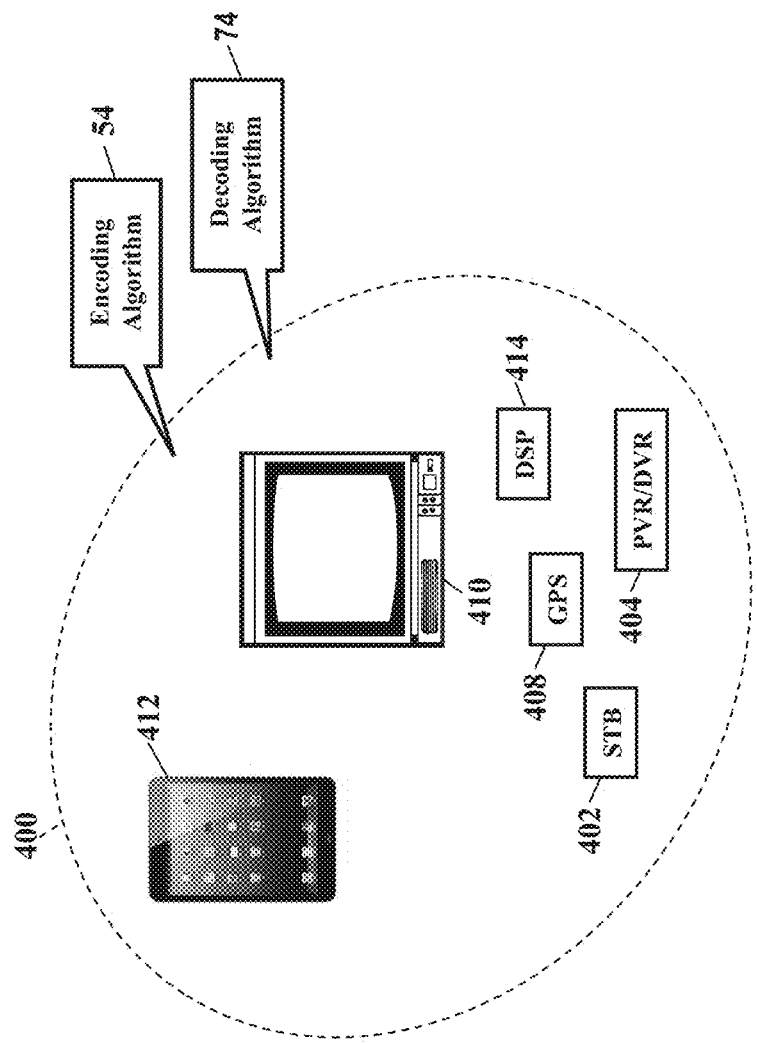

FIG. 7 depicts other possible operating environments for additional aspects of the exemplary embodiments. FIG. 7 illustrates the encoding algorithm 54 and the decoding algorithm 74 operating within various other devices 400. FIG. 7, for example, illustrates that the encoding algorithm 54 and the decoding algorithm 74 may entirely or partially operate within a set-top box ("STB") (402), a personal/digital video recorder (PVR/DVR) 404, a Global Positioning System (GPS) device 408, an interactive television 410, a tablet computer 412, or any computer system, communications device, or processor-controlled device utilizing the processor 52 and/or a digital signal processor (DP/DSP) 414. The device 400 may also include network switches, routers, modems, watches, radios, vehicle electronics, clocks, printers, gateways, mobile/implantable medical devices, and other apparatuses and systems. Because the architecture and operating principles of the various devices 400 are well known, the hardware and software componentry of the various devices 400 are not further shown and described.

Figure 8:
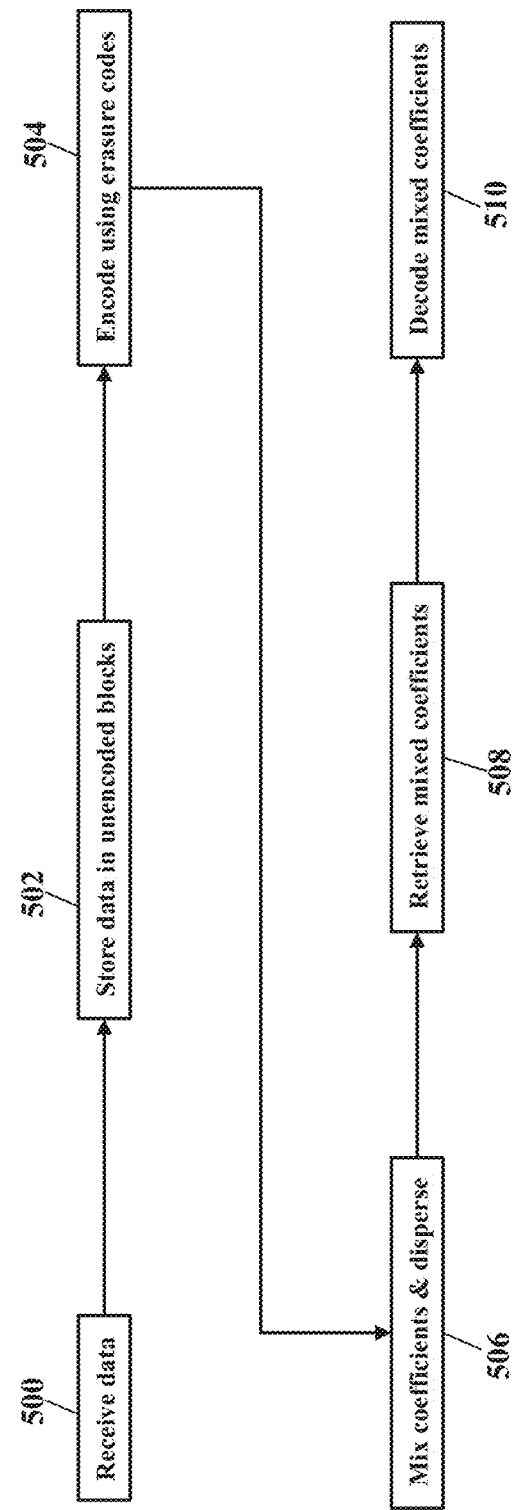
FIG. 8 is a flowchart illustrating a method or algorithm for storage of data, according to exemplary embodiments.

FIG. 8 is a flowchart illustrating a method or algorithm for storage of the data 36, according to exemplary embodiments. The data 36 is received (Block 500) and stored as the unencoded blocks 50 of data (Block 502). Each unencoded block 50 of data is encoded using the erasure codes 70 to generate an encoded block 58 of data (Block 504). Encoding yields the data messages 60 having the symbolic coefficients 72 which are mixed, mapped, and dispersed for storage at different storage nodes 20 (Block 506). Because the symbolic coefficients 72 are mixed, the mixed symbolic coefficients 72 may be retrieved from different storage nodes 20 (Block 508) to decode any data message 60 (Block 510).

Exemplary embodiments may be physically embodied on or in a computer-readable storage medium. This computer-readable medium, for example, may include CD-ROM, DVD, tape, cassette, floppy disk, optical disk, memory card, memory drive, and large-capacity disks. Indeed, exemplary embodiments may be embodied in any hardware device memory. This computer-readable medium, or media, could be distributed to end-subscribers, licensees, and assignees. A computer program product comprises processor-executable instructions for storage of data, as the above paragraphs explained.

While the exemplary embodiments have been described with respect to various features, aspects, and embodiments, those skilled and unskilled in the art will recognize the exemplary embodiments are not so limited. Other variations, modifications, and alternative embodiments may be made without departing from the spirit and scope of the exemplary embodiments.

The invention claimed is:

1. A system, comprising:
a processor; and
a memory that stores instructions that, when executed by the processor, cause the processor to perform operations comprising
obtaining a first set of data and a second set of data,
encoding the first set of data using an erasure code to generate a first set of coded symbols that represent the first set of data,
mixing the first set of coded symbols with the second set of data to generate a plurality of combined data values, wherein the second set of data is unencoded, and
transmitting the plurality of combined data values, the transmitting directed to a plurality of nodes of a distributed storage system.

2. The system of claim 1, wherein the instructions, when executed by the processor, cause the processor to perform operations further comprising:
detecting a failure of one of the plurality of nodes;
retrieving two of the plurality of combined data values from two of the plurality of nodes;
determining, based on the two of the plurality of combined data values, two of the first set of coded symbols, and
recovering the first set of data by decoding the two of the first set of coded symbols using the erasure code.

3. The system of claim 1, wherein the instructions, when executed by the processor, cause the processor to perform operations further comprising storing, in a database, a mapping of the plurality of combined data values to a plurality of node addresses that correspond to the plurality of nodes.

4. The system of claim 1, wherein the plurality of nodes comprises four nodes, and wherein the first set of data is recovered using three of the plurality of combined data values obtained from three of the four nodes.

5. The system of claim 1, wherein transmitting the plurality of combined data values comprises sending, to the plurality of nodes, a plurality of data messages that includes the plurality of combined data values.

6. The system of claim 1, wherein one of the plurality of combined data values comprises a sum of one of the first set of coded symbols and one of the second set of data, and wherein another of the plurality of combined data values comprises the one of the second set of data.

7. The system of claim 6, wherein the instructions, when executed by the processor, cause the processor to perform operations further comprising:
determining the one of the first set of coded symbols based upon the one of the plurality of combined data values and the other of the plurality of combined data values; and
decoding the one of the first set of coded symbols using the erasure code.

8. A method, comprising:
obtaining, at a storage server comprising a processor and a memory, a first set of data and a second set of data;
encoding, by the storage server and using an erasure code, the first set of data to generate a first set of coded symbols that represent the first set of data;
mixing, by the storage server, the first set of coded symbols with the second set of data to generate a plurality of combined data values, wherein the second set of data is unencoded; and
transmitting, by the storage server, the plurality of combined data values to a plurality of nodes of a distributed storage system.

9. The method of claim 8, further comprising:
detecting a failure of one of the plurality of nodes;
retrieving two of the plurality of combined data values from two of the plurality of nodes;
determining, based on the two of the plurality of combined data values, two of the first set of coded symbols, and
recovering the first set of data by decoding the two of the first set of coded symbols using the erasure code.

10. The method of claim 8, wherein the plurality of nodes comprises four nodes, and wherein the first set of data is recovered using any three of the plurality of combined data values obtained from three of the four nodes.

11. The method of claim 8, further comprising:
storing, in a database, a mapping of the plurality of combined data values to a plurality of node addresses that correspond to the plurality of nodes.

12. The method of claim 8, wherein transmitting the plurality of combined data values comprises transmitting, to the plurality of nodes, a plurality of data messages that includes the plurality of combined data values.

13. The method of claim 8, wherein one of the plurality of combined data values comprises a sum of one of the first set of coded symbols and one of the second set of data, and wherein another of the plurality of combined data values comprises the one of the second set of data.

14. The method of claim 8, further comprising:
determining the one of the first set of coded symbols based upon the one of the plurality of combined data values and the other of the plurality of combined data values; and
decoding the one of the first set of coded symbols using the erasure code.

15. A memory that stores instructions that, when executed by a processor, cause the processor to perform operations comprising:
obtaining a first set of data and a second set of data;
encoding the first set of data using an erasure code to generate a first set of coded symbols that represent the first set of data;
mixing the first set of coded symbols with the second set of data to generate a plurality of combined data values, wherein the second set of data is unencoded; and
transmitting the plurality of combined data values at a plurality of nodes of a distributed storage system.

16. The memory of claim 15, wherein the instructions, when executed by the processor, cause the processor to perform operations further comprising:
detecting a failure of one of the plurality of nodes;
retrieving two of the plurality of combined data values from two of the plurality of nodes;
determining, based on the two of the plurality of combined data values, two of the first set of coded symbols, and
recovering the first set of data by decoding the two of the first set of coded symbols using the erasure code.

17. The memory of claim 15, wherein one of the plurality of combined data values comprises a sum of one of the first set of coded symbols and one of the second set of data, and wherein another of the plurality of combined data values comprises the one of the second set of data.

18. The memory of claim 15, wherein transmitting the plurality of combined data values comprises sending, to the plurality of nodes, a plurality of data messages that includes the plurality of combined data values.

19. The method of claim 8, wherein each of the combined data values comprises a coded symbol and an unencoded data value included in the second set of data.

20. The memory of claim 15, wherein the instructions, when executed by the processor, cause the processor to perform operations further comprising storing, in a database, a mapping of the plurality of combined data values to a plurality of node addresses that correspond to the plurality of nodes.

* * * * *